United States Patent [19]

Farnworth et al.

[11] Patent Number: 5,786,632
[45] Date of Patent: Jul. 28, 1998

[54] SEMICONDUCTOR PACKAGE

[75] Inventors: Warren M. Farnworth, Nampa; Alan G. Wood, Boise; Trung Tri Doan, Boise; John O. Jacobson, Boise, all of Id.

[73] Assignee: Micron Technology, Inc., Boise, Id.

[21] Appl. No.: 717,820

[22] Filed: Sep. 24, 1996

Related U.S. Application Data

[63] Continuation of Ser. No. 565,864, Dec. 1, 1995, Pat. No. 5,593,927, which is a continuation-in-part of Ser. No. 294,183, Aug. 22, 1994, abandoned, which is a continuation of Ser. No. 137,645, Oct. 14, 1993, abandoned.

[51] Int. Cl.⁶ .......................... H01L 23/053; H01L 23/12
[52] U.S. Cl. .......................... 257/701; 257/700; 257/727; 257/731; 438/673; 438/701
[58] Field of Search .......................... 257/701, 620, 257/626, 700, 758, 727, 731; 438/673, 701

[56] References Cited

U.S. PATENT DOCUMENTS

| | | | |
|---|---|---|---|
| 4,040,084 | 8/1977 | Tanaka et al. | 357/55 |
| 4,341,569 | 7/1982 | Yaron et al. | 148/1.5 |
| 4,451,326 | 5/1984 | Gwozdz | 156/643 |
| 4,642,670 | 2/1987 | Striny | |
| 4,855,809 | 8/1989 | Malhi et al. | 357/75 |
| 4,878,099 | 10/1989 | Nilarp | 257/751 |
| 4,992,849 | 2/1991 | Corbett et al. | 357/72 |
| 4,992,850 | 2/1991 | Corbett et al. | 357/72 |
| 5,003,368 | 3/1991 | Roggwiller et al. | |
| 5,063,655 | 11/1991 | Lamey et al. | 29/611 |
| 5,104,324 | 4/1992 | Grabbe et al. | |
| 5,119,171 | 6/1992 | Lesk et al. | 257/626 |
| 5,138,434 | 8/1992 | Wood et al. | |
| 5,279,975 | 1/1994 | Devereaux et al. | 437/8 |
| 5,281,852 | 1/1994 | Normington | 257/685 |
| 5,336,928 | 8/1994 | Neugebauer et al. | 257/700 |
| 5,413,970 | 5/1995 | Russell | 437/208 |
| 5,557,148 | 9/1996 | Cain | 257/777 |

FOREIGN PATENT DOCUMENTS

| | | |
|---|---|---|
| 1-283939 | 11/1989 | Japan. |
| 3-72653 | 3/1991 | Japan. |
| 5-226325 | 3/1993 | Japan. |
| 5-267257 | 10/1993 | Japan. |
| 6-45315 | 2/1994 | Japan. |

*Primary Examiner*—Olik Chaudhuri
*Assistant Examiner*—Phat X. Cao
*Attorney, Agent, or Firm*—Stephen A. Gratton

[57] ABSTRACT

A method for packaging a semiconductor die includes forming an additional protective layer and conductive traces on the die. The die is then placed in a multi-die holder having electrical connectors for establishing an electrical connection to the conductive traces. The protective layer is formed as a thin or thick film of an electrically insulating material such as a polymer, glass, nitride or oxide. In addition, the protective layer can be formed with a tapered peripheral edge to facilitate insertion of the die into the die holder.

12 Claims, 6 Drawing Sheets

SEMICONDUCTOR PACKAGE

CROSS REFERENCE TO RELATED APPLICATION

This application is a continuation of application Ser. No. 08/565,864 filed Dec. 1, 1995, U.S. Pat. No. 5,593,927, which is a continuation-in-part of application Ser. No. 08/294,183 filed Aug. 22, 1994, abandoned, which is a continuation of application Ser. No. 08/137,645 filed Oct. 14, 1993 now abandoned.

FIELD OF THE INVENTION

This invention relates generally to semiconductor manufacture and specifically to the packaging of semiconductor dice.

BACKGROUND OF THE INVENTION

ICs have been both decreasing in size and increasing in circuit density for many years. Often the driving force behind these changes has been the consumer's demand for products requiring more memory in a smaller area.

Figure 1:
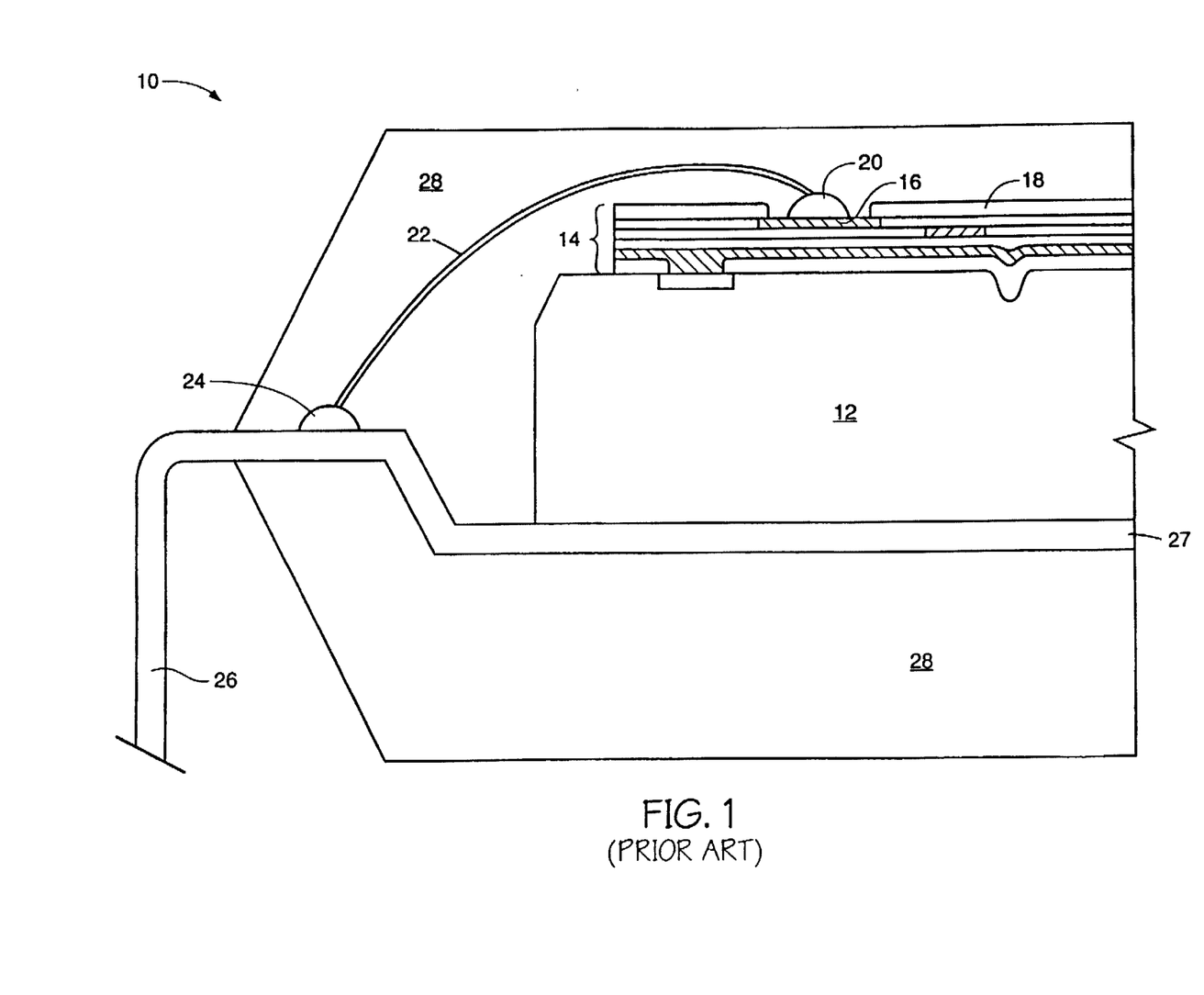
FIG. 1 is a schematic cross sectional view of a conventional prior art semiconductor package.

Conventionally, semiconductor dice are formed on a wafer of silicon material that is diced to form multiple bare dice. Each die is then individually packaged in a plastic or ceramic package. Typically, a lead frame supports the die for packaging and provides the lead system for the completed package. FIG. 1 illustrates a conventionally packaged die 10. The packaged die 10 includes a semiconducting substrate 12 formed with various electrical devices. Circuitry 14 is formed on the face of the die 10 to establish electrical communication between the electrical devices formed in the substrate 12 and the outside world. The circuitry 14 includes external bond pads 16 embedded in a passivation layer 18. During a packaging process each bond pad 16 is electrically connected to a corresponding lead 26 of a lead frame 27. The electrical connection includes a wire bond 20 formed on the bond pad 16, a wire lead 22 and a wire bond 24 formed on the lead 26. An encapsulating material 28 protects and insulates the die 12.

The packaged die 10 can be mounted to a printed circuit board (PCB) or other supporting substrate for constructing an electronic device such as a computer. One problem associated with a conventionally packaged die, such as packaged die 10, is that the package takes up a large amount of volume. This can make dense mounting of multiple packaged dice on a supporting substrate difficult to accomplish. This has led to the development of multi chip modules that utilize bare or unpackaged semiconductor dice. However, because bare dice are thin and fragile, packages called connectors have been developed to electrically connect and house multiple bare dice for mounting a supporting substrate to a printed circuit board. U.S. Pat. No. 5,104,324 to Grabbe et al. is one example of a "Multichip Module Connector" for bare dice.

One problem with this type of connector is that it is difficult to make a reliable electrical connection to the bare die. In addition, the bare die is often damaged during insertion into the connector. Accordingly, there is a need in the art for improved methods for packaging semiconductor dice that permit dice to be more densely packaged on a substrate and a reliable electrical connection to be made without damaging the dice.

In view of the foregoing, it is an object of the present invention to provide an improved method for packaging semiconductor dice. It is yet another object of the present invention to provide an improved method for packaging semiconductor dice that uses an additional protective layer to protect the face of a die and the circuits formed thereon from damage. It is a still further object of the present invention to provide an improved method for packaging a conventional bare semiconductor die and for making a reliable electrical connection to bond pads on the die.

Other objects, advantages and capabilities of the present invention will become more apparent as the description proceeds.

SUMMARY OF THE INVENTION

In accordance with the present invention, an improved method for packaging semiconductor dice and an improved semiconductor package are provided. The method, simply stated, comprises packaging a conventional bare semiconductor die by forming an additional protective layer and conductive traces on the face of the die and then placing the die in a die holder. The die holder includes a chamber for retaining the die and electrical connectors that make physical contact with exposed contact pads on the additional conductive traces.

The protective layer can be formed of an electrically insulating material such as a glass (e.g., BPSG) or polymer (e.g., polyimide). Depending on the material, either a thin film deposition process (e.g., CVD) or a thick film deposition process (e.g., spin on) can be used to form the protective layer. The protective layer includes a tapered peripheral edge to facilitate placing the die into the holder and establishing an electrical connection between the die and holder.

BRIEF DESCRIPTION OF THE PREFERRED EMBODIMENT

DETAILED DESCRIPTION OF THE PREFERRED EMBODIMENT

Figure 2:
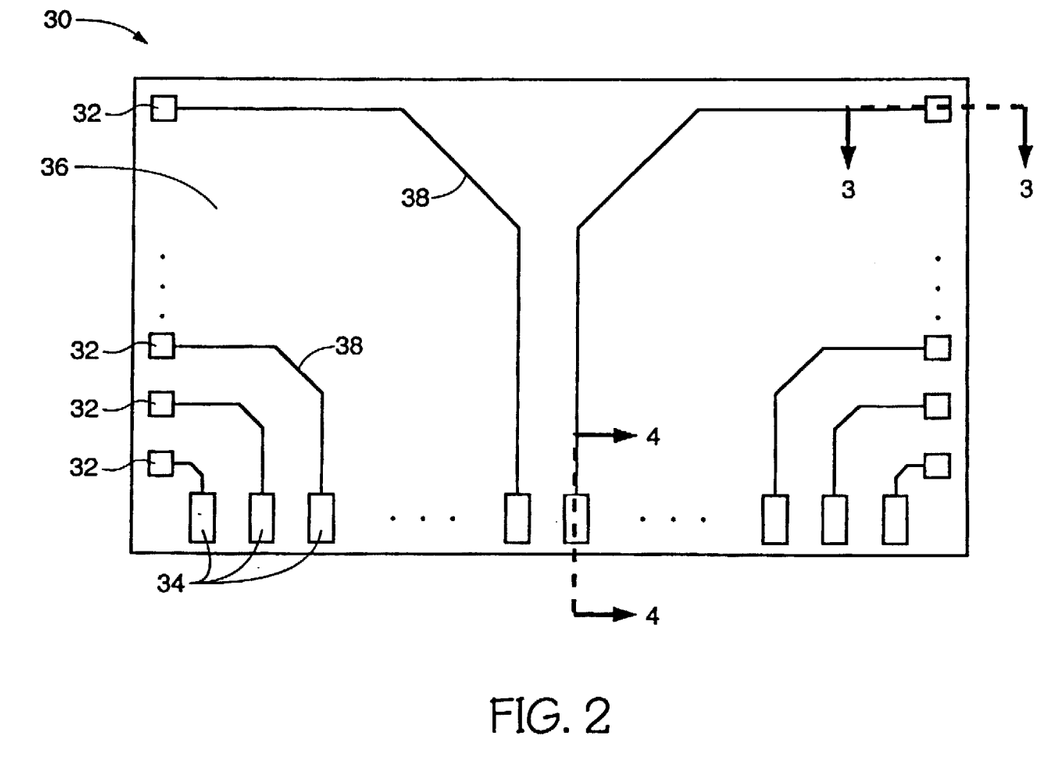
FIG. 2 is a schematic plan view of a die constructed in accordance with the invention.
Figure 3:
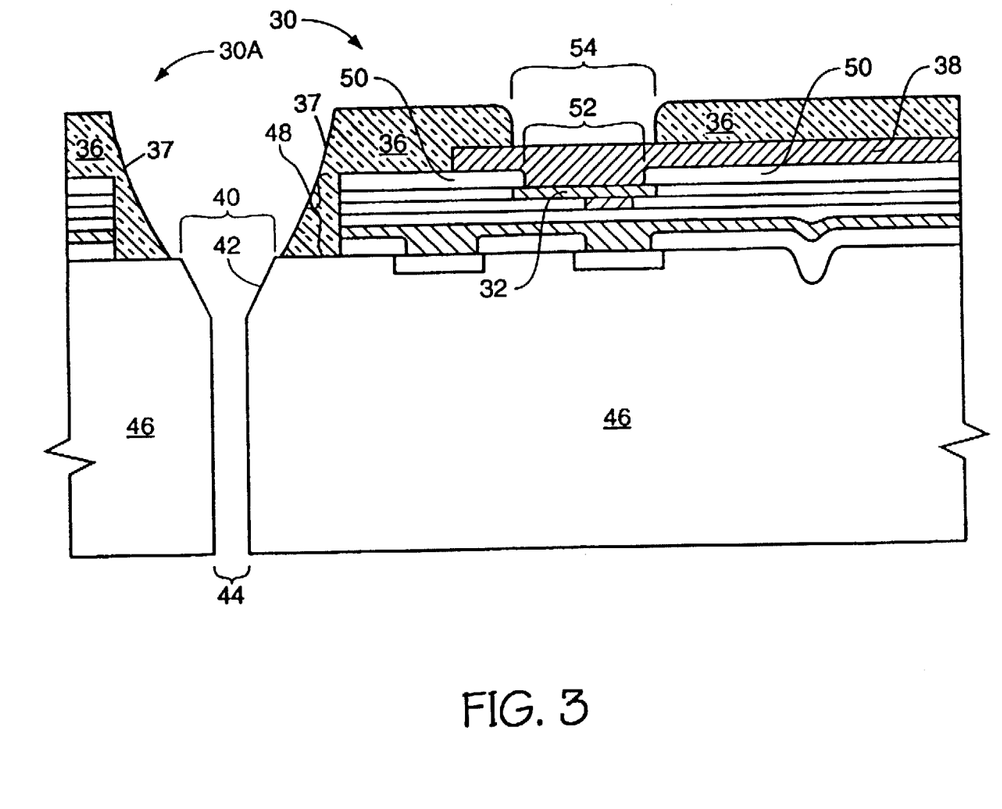
FIG. 3 is a schematic cross sectional view of the die taken along section line 3—3 of FIG. 2 shown alongside an adjacent die.

With reference to FIGS. 2 and 3, initially a semiconductor die 30 is formed or provided. The die 30 can be a conventional bare die that includes conventional circuitry 48 (FIG. 3) covered by a passivation layer 50. The circuitry 48 includes bond pads 32 aligned with bond pad vias 52 through the passivation layer 50. In addition, the die 30 includes a substrate 46 formed of silicon, or other semiconducting material, wherein various electrical devices are formed using techniques that are well known in the art. The electrical devices in the substrate 46 are in electrical communication with the bond pads 32. Preferably, multiple dice 30 are formed on a wafer (not shown) that is diced by saw cutting or other singulation process. FIG. 3 illustrates an adjacent die 30A as would occur on a wafer separated from the die 30 by a street 40.

In accordance with the invention, an additional protective layer 36 and pattern of conductive traces 38 are formed on the face of the die 30. The protective layer 36 and conductive traces 38 can also be formed at the wafer level prior to dicing of the wafer. The protective layer 36 is formed over the conventional circuitry 48 and covers the face of the die 30. The protective layer 36 can be formed of an electrically insulating material such as a polyimide, borophosphosilicate glass (BPSG), phosphosilicate glass (PSG), TEOS (deposited by the decomposition of tetraethyl orthosilicate), a nitride (e.g., $Si_3N_4$) or an oxide (e.g., $SiO_2$).

Figure 4:
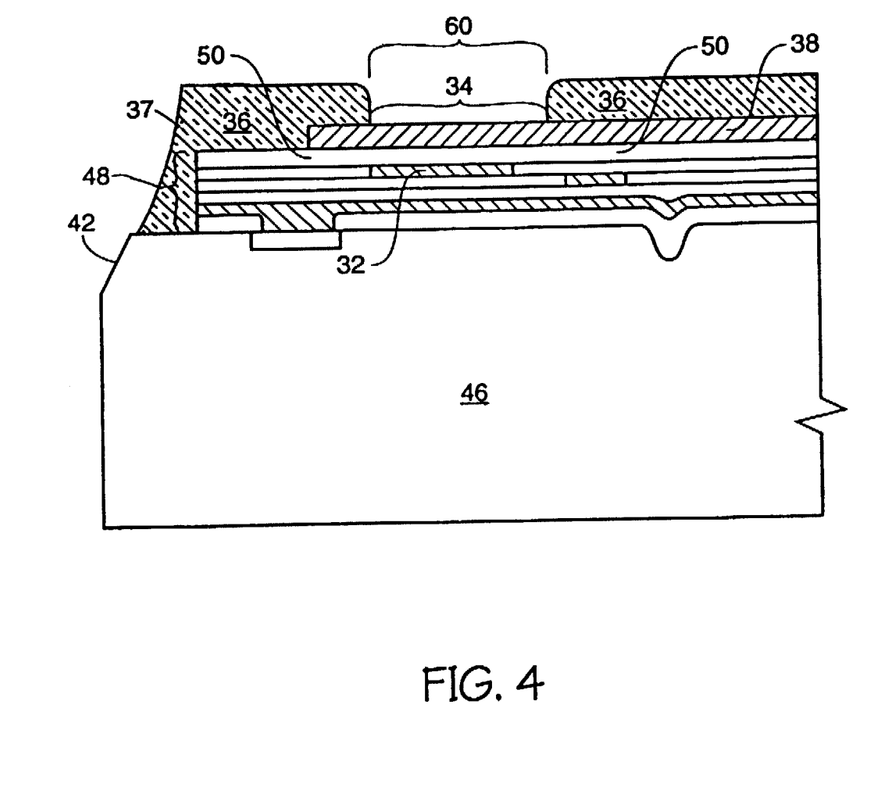
FIG. 4 is a schematic cross sectional view of the die taken along section line 4—4 of FIG. 2.

The conductive traces 38 are formed in electrical communication with the bond pads 32 on the die 30 and include exposed contact pads 34 (FIGS. 2 and 4). Prior to formation of the protective layer 36, the pattern of conductive traces 38 is formed on the passivation layer 50 of the die 30. The conductive traces 38 can be formed of a highly conductive metal such as aluminum, copper or alloys thereof, or a refractory metal such as titanium, tungsten, tantalum, molybdenum or alloys of these metals. The conductive traces 38 can be formed using a suitable metallization process such as blanket CVD deposition or sputtering, followed by photopatterning and etching. As an example, a wet etchant such as $H_3PO_4$ can be used to etch a photopatterned aluminum layer.

Following formation of the conductive traces 38, the protective layer 36 is formed over the face of the die 30. Depending on the material and deposition process, the thickness of the protective layer 36 can be from about 1 micron to 0.0005 inches (½ mil). The protective layer 36 can be deposited as a thin film using sputtering, evaporation, chemical vapor deposition (CVD) or plasma enhanced chemical vapor deposition (PECVD). The protective layer 36 can also be formed as a thick film of a polymeric material, such as polyimide, using a spin on deposition process. The spin on deposition process can include dispensing of a viscous material, spinning the die 30 (or wafer) to evenly distribute the viscous material and then curing the viscous material.

With reference to FIG. 4, following deposition of the protective layer 36, contact windows 60 are formed through the protective layer 36 to expose the contacts 34 for the conductive traces 38. Viewed from above, the contact windows 60 can have a circular, oval, half-circle, half-oval or rectangular peripheral configuration. As will be further explained, the contact windows 60 permit electrical connectors 90 (FIG. 7) on a die holder 70 (FIG. 5) to make physical contact with the contacts 34. The contact windows 60 can be formed using a wet or dry etch process in which a mask (not shown) is formed (e.g., photomask, hard mask) and the protective layer 36 is etched through openings in the mask.

At the same time that the contact windows 60 are formed through the protective layer 36 a pattern of bond pad windows 54 (FIG. 3) can be formed through the protective layer 36. The bond pad windows 54 are aligned with the bond pads 32 formed on the die 30. Viewed from above, the bond pad windows 54 can have a circular, oval, half-circle or half-oval, or rectangular peripheral configuration. The bond pad windows 54 permit additional electrical access to the bond pads 32 for testing or for making a permanent electrical connection to the die 30. For example, if the conductive traces 38 are formed of aluminum, a wire bond can be made through the bond pad windows 54 to the conductive traces 38. This wire bond would be an alternative to the electrical connection to the exposed contacts 34 (FIG. 4) of the conductive traces 38 to be hereinafter described.

As clearly shown in FIG. 3, the protective layer 36 is also formed with a tapered peripheral edge 37. One method of forming the tapered peripheral edge 37 is by etching. This etch step can be performed independently or at the same time as the etch step described above for forming the contact windows 60 and bond pad windows 54. As will be further explained, the tapered peripheral edge 37 aids in the insertion of the die 30 into the die holder 70 (FIG. 5) and helps to prevent damage and chipping of the protective layer 36 during insertion into the die holder 70.

As also shown in FIG. 3, prior to or at the same time that the tapered peripheral edge 37 is etched, the protective layer 36 can be etched to clear streets 40 for a saw blade (not shown). During a subsequent wafer dicing step, a saw is used to form a vertical cut 44 and a beveled edge 42 on the die 30. As also shown in FIG. 3, the circuitry 48 on the die 30 has been initially formed, or etched back, with a space between the beveled edge 42 of the die 30 and the exposed vertical edge of the circuitry 48. The protective layer 36 thus extends over the exposed vertical edge of the circuitry 48 but does not go over the edge of the die 30 substantially as shown in FIG. 3.

Figure 5:
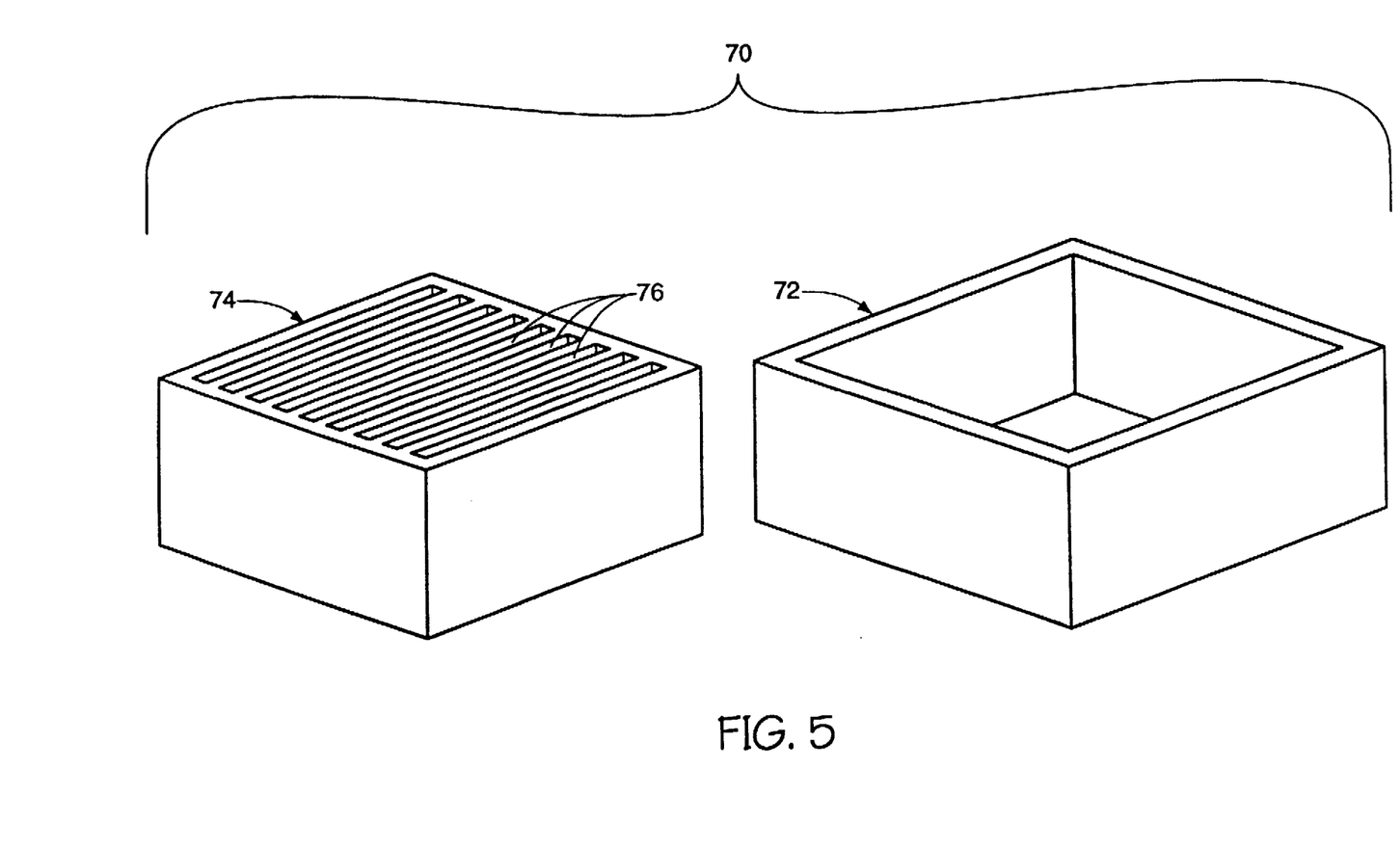
FIG. 5 is a perspective view of a die holder constructed in accordance with the invention.
Figure 6:
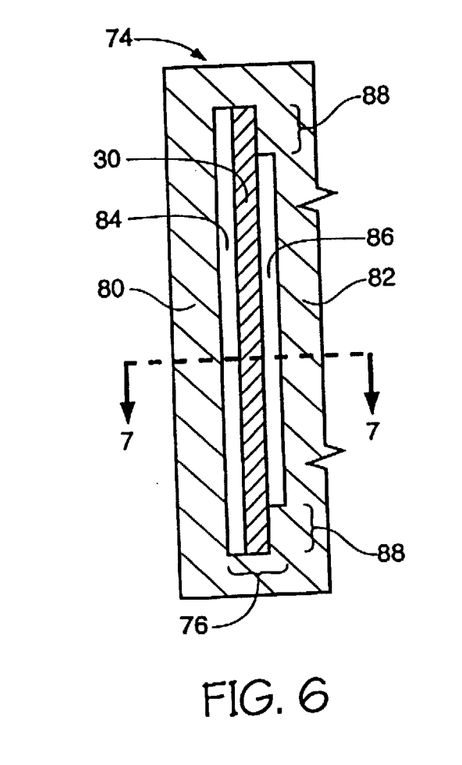
FIG. 6 is a schematic cross sectional view of the die packaged in the die holder.
Figure 7:
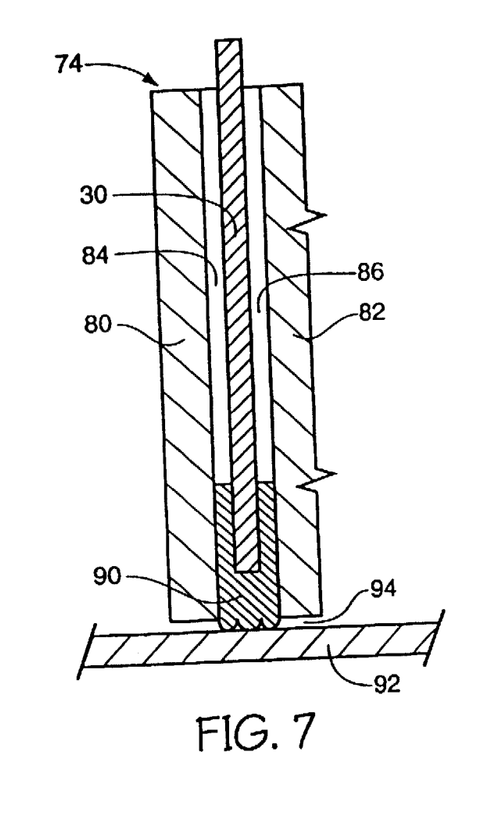
FIG. 7 is a schematic cross section taken along section line 7—7 of FIG. 6 showing the packaged die mounted to a printed circuit board.

Referring now to FIGS. 5–7, following formation of protective layer 36 and singulation of the die 30 from the wafer, the die 30 is placed into a die holder 70. As shown in FIG. 5, the die holder 70 includes a base 74 having multiple die cavities 76 wherein multiple dice 30 formed as previously described are placed. In addition, the die holder 70 includes a cover 72 that is adapted to retain the dice 30 in the die cavities 76. The base 74 and cover 72 can be formed of a suitable molded plastic material such as a liquid crystal polymer. The die holder 70 is also described in related copending U.S. patent application Ser. No. 08/353,769 entitled "Multi-Die Encapsulation Device and Process for Encapsulation of Multi-Die", filed Dec. 12, 1994, which is incorporated herein by reference.

As clearly shown in FIG. 6, each die cavity 76 on the base 74 is adapted to retain a single die 30. Each die cavity 76 is defined by a first wall 80 and a second wall 82 formed integrally with the base 74. In addition, each die cavity 76 includes a circuit protection portion 84 for the die 30 and a tool insertion portion 86 for manipulating an insertion tool (not shown) for inserting the die 30 into the die cavity 76. In addition, each die cavity 76 includes a shelf 88 for engaging a back side of the die 30.

As clearly shown in FIG. 7, the edge of the die 30 wherein the contact pads 34 (FIG. 2) are located is engaged by an electrical connector 90. The electrical connector 90 can be a generally unshaped member as shown or can be a spring member as described in the above cited U.S. patent application. The connector 90 is adapted to physically contact the contact pads 34 on the die 30 and corresponding connection points 94 on a printed circuit board 92. This establishes an electrical connection between the die 30 and circuit board 92. The connector 90 can be bonded to the connection point 94 using a bonding technique such as soldering. In addition, the connector 90 can be formed as a compliant foot as described in the above cited U.S. Patent application.

The cover 72 (FIG. 5) is adapted to be attached to the base 74 to retain the dice 30 within the die cavities 76. The cover 72 can be attached to the base 74 using a suitable adhesive such as a curable epoxy. In addition, the cover 72 can include a resilient biasing pad as described in the above cited U.S. Patent application to help maintain the die 30 in contact with the connector 90.

One suitable insertion tool for inserting the die 30 into the cavity 76 is also described in the above cited patent application. This type of insertion tool is known in the art and includes a vacuum conduit for holding the die 30 on the tool. During the insertion process the protective layer 36 protects the face of the die 30 and the circuitry 48 (FIG. 3) formed thereon from damage. In addition, during the insertion process the beveled edge 42 (FIG. 3) of the die 30 and the tapered edge 37 (FIG. 7) of the protective layer 36 function as guide surfaces for guiding the connectors 90 on the holder 70 into electrical contact with the contact pads 34 (FIG. 3) on the die 30. The tapered edge 37 also helps to prevent chipping and damage of the protective layer 36 during the insertion process. In addition, the contact windows 60 (FIG. 4) through the protective layer 36 are formed with rounded edges that permit the electrical connectors 90 to engage the contact pads 34 (FIG. 4) without damage to the protective layer 36.

While the invention has been described with reference to certain preferred embodiments, as will be apparent to those skilled in the art, certain changes and modifications can be made without departing from the scope of the invention as defined by the following claims.

What is claimed is:

1. A semiconductor package comprising:

a semiconductor die comprising a plurality of bond pads and a passivation layer formed on a face thereof, the die having a beveled edge;

a plurality of conductive traces on the passivation layer, at least some of the conductive traces in electrical communication with at least some of the bond pads;

a plurality of exposed contact pads on the face of the die, at least some of the contact pads in electrical communication with at least some of the conductive traces;

a protective layer on the conductive traces, the protective layer having vias therethrough to the contact pads, the protective layer having a tapered edge; and a die holder retaining the die, the holder comprising a plurality of connectors, at least some of the connectors electrically contacting the exposed contact pads, the connectors configured to slide over the beveled edge and tapered edge during insertion of the die into the holder.

2. The package of claim 1 wherein the protective layer comprises polyimide.

3. A semiconductor package comprising:

a semiconductor die including bond pads and a passivation layer on a face of the die, the bond pads comprising wire bondable metal pads;

a pattern of conductive traces formed on the passivation layer, at least some of the conductive traces in electrical communication with at least some of the bond pads;

a polyimide protective layer formed on the conductive traces, the protective layer having a pattern of contact windows therethrough leaving exposed contact pads on at least some of the conductive traces;

a die holder including a chamber enclosing the die and having connectors electrically connected to at least some of the contact pads; and a beveled edge on the die and a tapered edge on the protective layer configured to guide the connectors over the protective layer during placement of the die in the holder.

4. A semiconductor package comprising:

a die holder comprising a cavity and a plurality of electrical connectors extending into the cavity;

a semiconductor die placed in the cavity, the die comprising a face and bond pads formed on the face, the bond pads comprising wire bondable metal pads in electrical communication with integrated circuits on the die;

a passivation layer formed on the face of the die leaving at least some of the bond pads exposed;

a pattern of conductive traces formed on the passivation layer in electrical communication with at least some of the bond pads;

a protective layer formed on the face of the die, the protective layer having a pattern of contact windows formed therethrough to the conductive traces, thereby providing access for the connectors to physically and electrically contact the conductive traces; and a plurality of bond pad windows through the protective layer configured to provide electrical access to the bond pads.

5. The package of claim 4 and wherein the protective layer comprises a tapered peripheral edge configured to guide the connectors over the protective layer during placement of the die in the holder.

6. The package of claim 4 wherein the die comprises a beveled edge configured to guide the connectors over the die during placement of the die in the holder.

7. The package of claim 4 wherein the contact windows comprise rounded edges configured to guide the connectors into the contact windows during placement of the die in the holder.

8. A semiconductor package comprising:

a semiconductor die including a face with an electrically insulating first layer, and plurality of wire bondable pads in electrical communication with integrated circuits on the die;

a pattern of conductors on the first layer, the conductors in electrical communication with the pads;

an electrically insulating second layer on the conductive traces, the second layer having a tapered edge and including openings with rounded edges therethrough to exposed portions of the conductors; and a die holder comprising a cavity wherein the die is retained, the holder further comprising a plurality of connectors extending through the openings and physically and electrically contacting the exposed portions of the conductors, the connectors configured to slide over the tapered edge and rounded edges as the die is placed in the cavity.

9. The package of claim 8 wherein the die includes a beveled edge configured to guide the connectors over the die during placement of the die in the cavity.

10. A semiconductor package comprising:

a semiconductor die;

an electrically insulating passivation layer on a face of the die;

a plurality of wire bondable bond pads in the passivation layer in electrical communication with integrated circuits on the die;

a pattern of conductive traces on the passivation layer, the conductive traces in electrical communication with the bond pads;

a plurality of contact pads on the conductive traces;

an electrically insulating protective layer on the conductive traces, the protective layer including first openings therethrough to the contact pads and second openings therethough to provide electrical access to the bond pads, the protective layer including a tapered edge; and a die holder comprising a cavity wherein the die is retained, the holder further comprising a plurality of connectors configured to slide over the tapered edge into the first and second openings and physically and electrically contact the contact pads.

11. The package of claim 10 wherein the die includes a beveled edge for guiding the connectors over the die without substantially damaging the die.

12. The package of claim 10 wherein the first openings are shaped to allow the connectors to contact the contact pads without substantially damaging the protective layer.

* * * * *